United States Patent
Fischer et al.

(10) Patent No.: US 6,808,640 B2
(45) Date of Patent: Oct. 26, 2004

(54) MICROMECHANICAL PART AND METHOD FOR ITS MANUFACTURE

(75) Inventors: Frank Fischer, Gomaringen (DE); Wilhelm Frey, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 157 days.

(21) Appl. No.: 10/077,422

(22) Filed: Feb. 14, 2002

(65) Prior Publication Data

US 2002/0155711 A1 Oct. 24, 2002

(30) Foreign Application Priority Data

Feb. 14, 2001 (DE) .......................................... 101 06 715

(51) Int. Cl.⁷ ................................................. B81C 1/00
(52) U.S. Cl. ................................ 216/2; 216/39; 216/41; 216/49; 427/248.1; 427/250
(58) Field of Search ................................ 216/2, 39, 41, 216/49; 427/248.1, 250

(56) References Cited

U.S. PATENT DOCUMENTS

| | | | | |
|---|---|---|---|---|
| 5,858,809 A | * | 1/1999 | Chau et al. | 438/52 |
| 6,210,988 B1 | * | 4/2001 | Howe et al. | 438/50 |
| 6,698,295 B1 | * | 3/2004 | Sherrer | 73/754 |
| 2004/0047546 A1 | * | 3/2004 | Gasparyan et al. | 385/18 |

* cited by examiner

*Primary Examiner*—Anita Alanko
(74) *Attorney, Agent, or Firm*—Kenyon & Kenyon

(57) ABSTRACT

A method for manufacturing a micromechanical part, having a plurality of components that move with respect to one another, from a substrate, with a conductive coating being applied to at least one facing surface of the plurality of components that move with respect to one another.

13 Claims, 2 Drawing Sheets

MICROMECHANICAL PART AND METHOD FOR ITS MANUFACTURE

FIELD OF THE INVENTION

The present invention relates to a micromechanical part and a method for its manufacture.

BACKGROUND INFORMATION

The function of micromechanical parts may be impaired by adhesive forces that are active, when unfavorable conditions exist between facing surfaces of moving components of the parts. This adhesive tendency, also known as "stiction," may be attributable to Van der Waals and capillary forces, electrostatic interaction, physical bonds and hydrogen bridge bonds between facing surfaces.

This adhesive phenomena may considerably impair the operational capability of micromechanical parts, such as, for example, sensors, such as acceleration or engine speed sensors. Such sensors may include a seismic mass, which is moveable against a surrounding frame under the influence of the acceleration or rotation to be detected, and the movement of which may be detected by verifying the change in capacity of capacitors, the plates of which are formed by facing surfaces of the seismic mass and the frame. Each adhesive force, which is active between facing surfaces of this type and causes the seismic mass to move, may result in severe corruption of the sensor measurement results.

To reduce solid-state adhesion, these surfaces may be chemically stabilized with masking layers, such as self-organizing monolayers, the surfaces of which are hardened by coating, for example, with adamantine carbon layers, or the surface topography of which, i.e., the shape of the contact surfaces and, for example, their surface roughness, is optimized. These methods may be costly, since the facing surfaces may not be easily accessible for subsequent processing. In addition, they may not always produce the desired results.

SUMMARY OF THE INVENTION

An exemplary micromechanical part according to the present invention and an exemplary method according to the present invention for its manufacture, which is believed to be simple and economical, may effectively reduce the adhesive phenomena.

An exemplary embodiment according to the present invention is based on corrupted measured values in micromechanical sensors varying gradually during the course of sensor operation, which may be attributed to the gradual formation of electrostatic charges on non-conductive sensor surfaces. To eliminate these electrostatic charges, a conductive coating may be provided, at least on facing surfaces of a micromechanical part, to enable the electrostatic charges to dissipate.

The conductivity of a coating of this type may be orders of magnitude lower than that of a typical electrical conductor of the micromechanical part, such as the supply conductor of a capacitor electrode. A low conductivity may be sufficient to dissipate minimal current intensities associated with electrostatic charges, without noticeably impairing the operation of the part.

To apply a coating having a nonvanishing, yet low, conductivity in a controlled manner, the coating may be created from a material that has a nonvanishing conductivity and does not form a highly insulating oxide on its surface. One suitable material is germanium, which may be applied in its pure form or, if necessary, with a dopant to control its conductivity.

If a substrate of the micromechanical part is made of silicon, a germanium coating may be easily structurable, since, while germanium nucleates on a silicon surface, it does not nucleate on a surface made of silicon oxide.

An object of an exemplary embodiment of the present invention is to provide a method for manufacturing a micromechanical part, having components that move with respect to one another, from a substrate, with a conductive coating being applied at least to facing surfaces of the components that move with respect to one another. A substrate of this type may suitably include a functional layer, which is structured, and an underlying sacrificial layer. The components that move with respect to one another may then be manufactured by etching trenches through the functional layer to the sacrificial layer and the removing of the sacrificial layer beneath at least one of the components.

The coating material is suitably selected, so that it accumulates on the functional layer, but not on the sacrificial layer. Applying the coating after etching the trenches, but before removing the sacrificial layer, permits the coating to be selectively applied, for example, to the side walls of the trenches, which, in a finished electromechanical part, form facing surfaces of the components that move with respect to one another, without requiring a separate masking step.

Germanium, for example, meets these requirements, if the functional layer is made of silicon and the sacrificial layer is made of silicon oxide.

Before the functional layer is structured by producing trenches therein, a masking layer is produced on part of the functional layer, and the trenches are formed by etching a portion of the functional layer not covered by the masking layer. Removing the masking layer only after the conductive coating is applied may prevent, depending on the type of masking layer, the coating material from being deposited on the masking layer or the deposited coating material from being removed with the masking layer. In this manner, an exterior of the substrate that was originally covered by the masking layer may be kept free of the conductive coating, in the finished part.

However, the masking layer may also be removed before applying the conductive coating, if a coating of this type on the external surface is desired or acceptable.

An LPCVD (low-pressure chemical vapor deposition) method may be used for depositing the coating, since this method may be performed at low temperatures, which avoids impairing a previously produced structure of the part.

DETAILED DESCRIPTION

Figure 1:
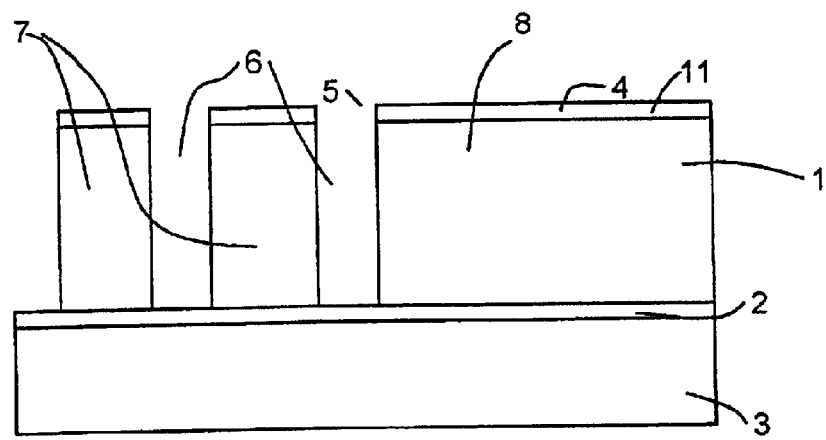
FIG. 1 is a diagram showing a step(s) in a first exemplary method according to the present invention for manufacturing a micromechanical part.

FIG. 1 shows a cross-section of a substrate, from which a micromechanical part may be manufactured. The substrate may be manufactured by depositing a functional layer 1 made of polycrystalline silicon on a base 3 made of silicon and covered by a $SiO_2$ sacrificial layer 2. A photoresist layer 4 is applied to functional layer 1, and trenches 6 are etched through functional layer 1 to sacrificial layer 2 in windows 5, which are created by exposing and developing photoresist layer 4. Methods for producing the substrate layer structure and for structuring functional layer 1 are available and therefore are not described in detail.

Trenches 6 separate two narrow ribs 7 of functional layer 1 from each other and from a massive segment 8. Ribs 7 are provided, for example, to create longitudinal, parallel electrode fingers on the finished micromechanical part, with one electrode finger, for example, being connected on the narrow side to a seismic mass (not shown) and the other to massive segment 8, which also remains connected to base 3 in the finished part.

Figure 2:
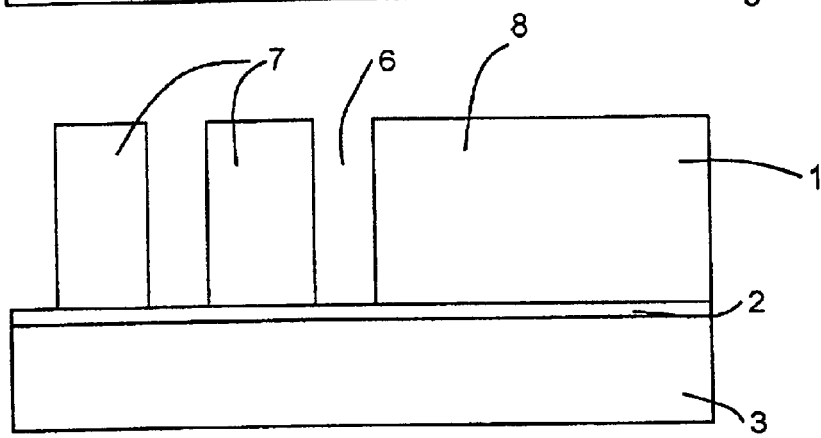
FIG. 2 is a diagram showing another step(s) in a first exemplary method according to the present invention for manufacturing a micromechanical part.
Figure 3:
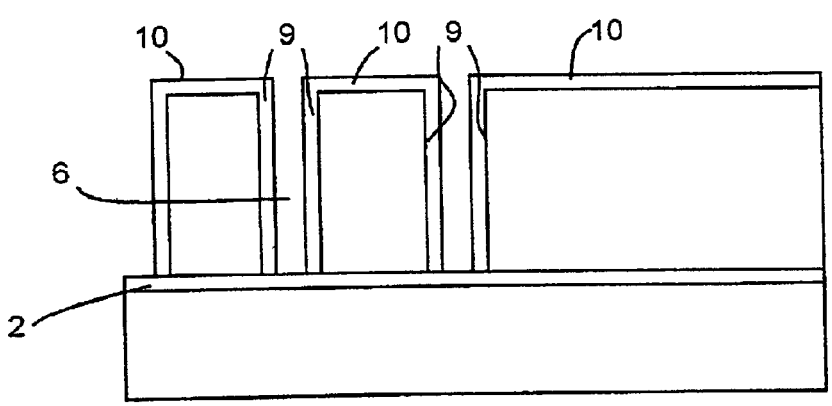
FIG. 3 is a diagram showing another step(s) in a first exemplary method according to the present invention for manufacturing a micromechanical part.
Figure 4:
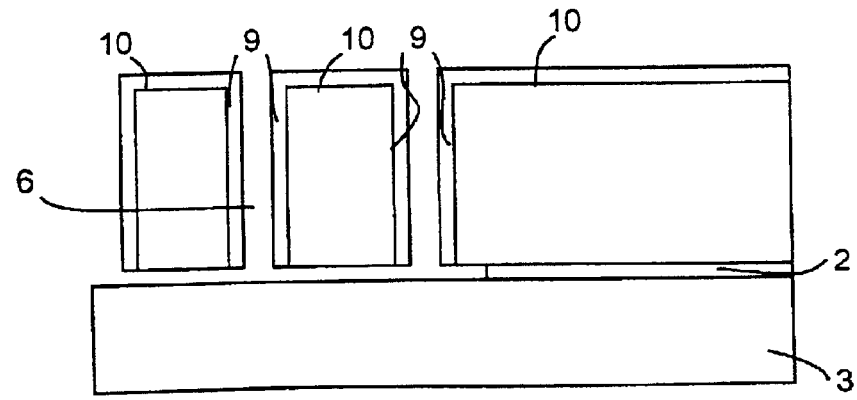
FIG. 4 is a diagram showing another step(s) in a first exemplary method according to the present invention for manufacturing a micromechanical part.

As shown in FIG. 2, photoresist layer 4 is removed on the outer surface of the substrate. At this point, the substrate is ready for LPCVD treatment with $GeH_4$, after which, as shown in FIG. 3, all exposed surfaces of functional layer 1, i.e., both the external surface and facing surfaces 9 of ribs 7 and massive segment 8, respectively, are covered with a thin coating 10 of germanium. Sacrificial layer 2, which is exposed on the floor of trenches 6, remains uncovered, since germanium does not accumulate on $SiO_2$. Sacrificial layer 2 is then etched through trenches 6, until the bottoms of ribs 7 are freed and unconnected, as shown in FIG. 4.

If, for example, a photoresist layer 4 is used to mask the areas of functional layer 1 that are not to be etched, the photoresist layer is suitably removed prior to LPCVD treatment, since photoresists may be unstable at temperatures for the LPCVD process (e.g., 350° C. to 500° C.).

According to a second exemplary method of the present invention, the outside of the substrate may also be covered with an oxide layer, i.e., an $SiO_2$ layer 11, as the masking layer, and trenches 6 may be etched in windows of the $SiO_2$ layer. The cross-section of this structure may be identical to the one shown in FIG. 1.

Figure 5:
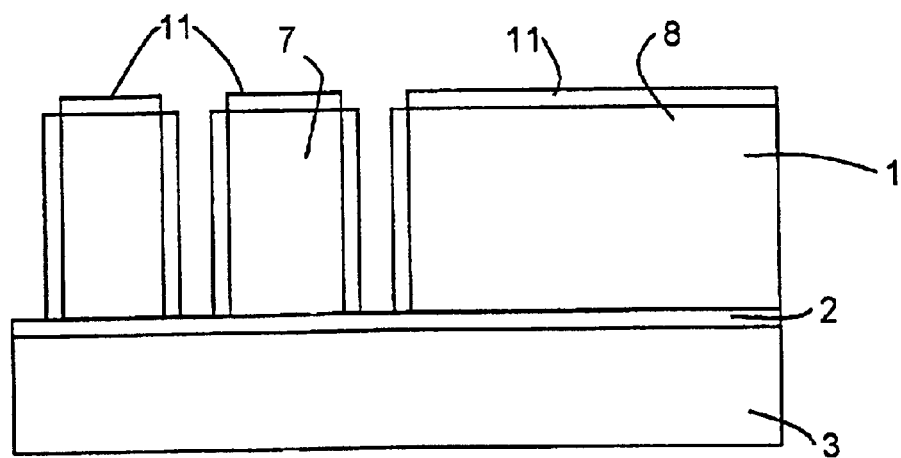
FIG. 5 is a diagram showing a step(s) in a second exemplary method according to the present invention.

However, since $SiO_2$ layer 11 is stable at high temperatures, germanium layer 10 may be applied in an LPCVD process, without first removing passivating $SiO_2$ layer 11 on the outside of the substrate. The result is shown in FIG. 5. Germanium coating 10, as shown in FIG. 5, covers only facing surfaces 9 of ribs 7 and massive segment 8, respectively, which form the side walls of trenches 6.

Figure 6:
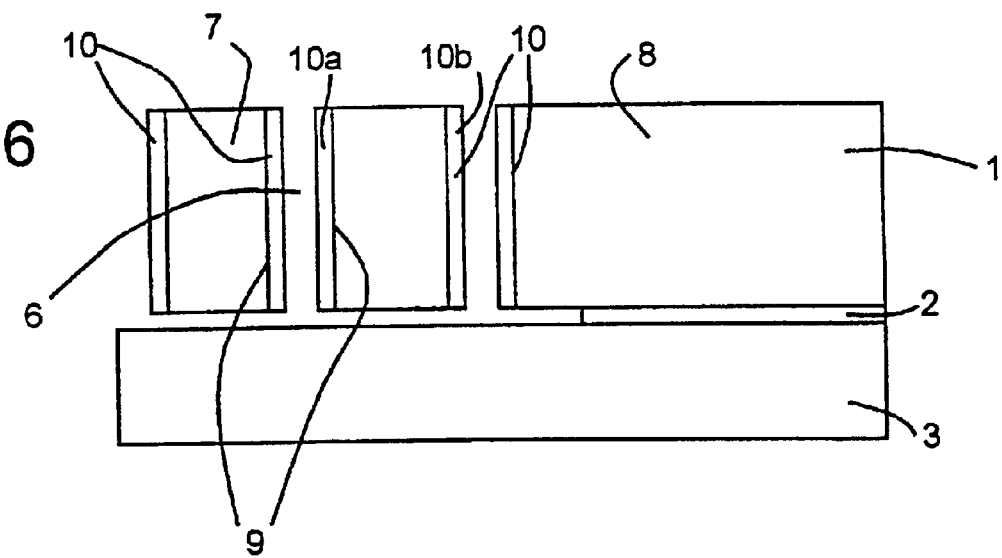
FIG. 6 is a diagram showing another step(s) in a second exemplary method according to the present invention.

If sacrificial layer 2 beneath ribs 7 is subsequently etched away, $SiO_2$ layer 11 may be simultaneously removed on the outside of the substrate. The result is shown in FIG. 6. Since no conductive coating 10 is present on the outside of the substrate, coating segments, such as, for example, 10a and 10b, may be electrically isolated from each other on non-facing surfaces of the same rib 7, provided that trenches 6 surrounding rib 7 are not connected to each other.

What is claimed is:

1. A method for manufacturing a micromechanical part from a substrate, the micromechanical part including a plurality of components configured to move with respect to one another, the method comprising:

applying a conductive coating at least to a facing surface of each of the plurality of components, wherein the conductive coating includes germanium and is configured to dissipate a charge between the components.

2. The method of claim 1, wherein:

the a substrate includes a functional layer to be structured and an underlying sacrificial layer; and the plurality of components are produced by etching at least one trench through the national layer of the substrate to the underlying sacrificial layer of the substrate, and removing the sacrificial layer beneath at least one of the plurality of components.

3. The method of claim 1, wherein the substrate includes silicon.

4. The method of claim 2, wherein the conductive coating is applied after etching the at least one trench and before the removing of the underlying sacrificial layer.

5. The method of claim 2, wherein the underlying sacrificial layer includes $SiO_2$.

6. The method of claim 2, wherein:

the functional layer is structured by applying a masking layer on a portion of the functional layer; and at least one trench is formed by etching a portion of the functional layer not covered by the masking layer, and removing the masking layer after applying the conductive coating.

7. The method of claim 2, wherein:

the functional layer is structured by applying a masking layer on a portion of the functional layer; and at least one trench is formed by etching another portion of the functional layer not covered by the masking layer, and removing the masking layer before applying the conductive coating.

8. The method of claim 6, wherein the masking layer is one of an o a layer or a resist layer.

9. The method of claim 1, wherein the applying of the conductive coating is done by an LPCVD process.

10. The method of claim 7, wherein the masking layer is on of an oxide layer or a resist layer.

11. The method of claim 1, wherein the charge contributes to an adhesive force.

12. The method of claim 1, wherein the conductive coating is applied one of in a pure form or with a dopant.

13. The method of claim 7, further comprising:

applying the conductive coating to an external surface of each of the plurality of components.

* * * * *